(12) United States Patent
Che

(10) Patent No.: US 11,612,981 B2
(45) Date of Patent: Mar. 28, 2023

(54) SUBSTRATE PROCESSING APPARATUS

(71) Applicant: KCTECH CO., LTD., Anseong-si (KR)

(72) Inventor: Huiseong Che, Pyeongtaek-si (KR)

(73) Assignee: KCTECH CO., LTD., Anseong-si (KR)

( * ) Notice: Subject to any disclaimer, the term of this patent is extended or adjusted under 35 U.S.C. 154(b) by 861 days.

(21) Appl. No.: 16/575,176

(22) Filed: Sep. 18, 2019

(65) Prior Publication Data

US 2020/0164486 A1 May 28, 2020

(30) Foreign Application Priority Data

Nov. 28, 2018 (KR) .......................... 10-2018-0149210

(51) Int. Cl.
| | |
|---|---|
| *B24B 49/10* | (2006.01) |
| *B24B 37/005* | (2012.01) |
| *B24B 53/017* | (2012.01) |
| *H01L 21/67* | (2006.01) |
| *B24B 37/26* | (2012.01) |

(52) U.S. Cl.
CPC .......... *B24B 49/105* (2013.01); *B24B 37/005* (2013.01); *B24B 37/26* (2013.01); *B24B 53/017* (2013.01); *H01L 21/67253* (2013.01)

(58) Field of Classification Search
CPC ....... B24B 53/12; B24B 53/02; B24B 53/017; B24B 53/005; B24B 49/105
See application file for complete search history.

(56) References Cited

U.S. PATENT DOCUMENTS

2008/0004743 A1* 1/2008 Goers .................. B24B 53/017
700/121

FOREIGN PATENT DOCUMENTS

| | | | |
|---|---|---|---|
| CN | 207120144 U | * 3/2018 | |
| KR | 100630754 B1 | * 10/2006 | |
| KR | 20160051219 A | * 5/2016 | ........... B24B 49/186 |

* cited by examiner

*Primary Examiner* — Joel D Crandall
(74) *Attorney, Agent, or Firm* — Stein IP LLC

(57) ABSTRACT

Provided is a substrate processing apparatus. The substrate processing apparatus comprises a polishing table; a polishing pad disposed on an upper surface of the polishing table; a conditioner including a conditioner head, a disk holder movably coupled to the conditioner head in a vertical direction, and a conditioning disk mounted to the disk holder and in contact with the polishing pad; and a thickness measuring unit of obtaining the thickness of the polishing pad from the relative moving distance of the disk holder with respect to the conditioner head, wherein the information of the relative moving distance is received from sensing unit.

12 Claims, 14 Drawing Sheets

SUBSTRATE PROCESSING APPARATUS

CROSS-REFERENCE TO RELATED APPLICATIONS

This U.S. non-provisional patent application claims priority under 35 U.S.C. § 119 of Korean Patent Application Nos. 10-2018-0149210 filed on Nov. 28, 2018, the entire contents of which are hereby incorporated by reference.

BACKGROUND OF THE INVENTION

The present invention relates to a substrate processing apparatus, and more particularly, to a substrate processing apparatus capable of accurately measuring the thickness of a polishing pad and controlling chemical mechanical polishing process parameters according to the state of the polishing pad.

As the semiconductor device is manufactured by integrating fine circuit lines at a high density, a precision polishing is performed on the wafer surface. In order to precisely polish the substrate, a chemical mechanical polishing process (CMP process) in which both mechanical polishing and chemical polishing is performed as shown in FIGS. 1 and 2. That is, the polishing pad 11 covering the upper surface of the polishing table 10 is installed to contact with the substrate W and is installed to rotate 11$d$ together with the polishing table 10. And the slurry of the supply unit 30 for chemical polishing is supplied through the slurry supply port 32. Thus while the substrate experiences chemical polishing by the slurry, the substrate also experiences mechanical polishing by friction. At this time, the substrate W is rotated 20$d$ at a predetermined position with being pressed by the carrier head 20 to precisely perform a polishing process.

The slurry applied to the surface of the polishing pad 11 is evenly purged on the polishing pad 11 by the conditioner 40 which rotates in the direction indicated by 40$d$ and the arm 41 pivots in the direction indicated by 41$d$ so that the slurry is introduced into the substrate W. The polishing pad 11 may maintain a constant polishing table by a mechanical dressing process of the conditioner 40.

Meanwhile, wear of the polishing pad made of urethane material occurs while the polishing process is performed in which the substrate W is in contact with the polishing pad 11. Since it is difficult to accurately control the polishing thickness and which causes to deteriorate the polishing quality, the polishing pad 11 should be replaced periodically when the polishing pad 11 has been used for a predetermined life time or more.

However, the pressing force by the carrier head 20 and the slurry used in the chemical mechanical polishing process differ in view of the material of the substrate, and recently. As the pressing force of the conditioner 40 and the pressing of the carrier head 20 have been tried to be controlled during the chemical mechanical polishing process, even when the polishing pad 11 is used for an expected life time, some polishing pads may wear more than their life, while other polishing pads may be usable in more time although they have been used for its expected lifetime.

Therefore, in the conventional arts, the timing of replacing the polishing pad 11 may not be accurately detected. Thus, although the polishing pad may be usable, the polishing pad is replaced by a new one whereby the process efficiency may be reduced because the polishing process should be stopped to replace the polishing pad. There is an also problem that the polishing quality of the substrate is degraded as the chemical mechanical polishing process is performed with a polishing pad of which state is not usable.

Accordingly, in recent years, various studies have been made to accurately measure the amount of wear of a polishing pad and to accurately sense the accurate time of replacing the worn polishing pad, but there is still a need for development thereof.

The above-described background art describes other configurations obtained in the course of deriving the present invention to facilitate understanding of the present invention, and does not mean the prior art known before the filing date of the present invention.

SUMMARY OF THE INVENTION

The present invention has been made in view of the technical background described above and it is an object of the present invention to provide a membrane and carrier head having a structure of uniformly maintaining the pressing force applied to the edge of the substrate regardless of the amount of wear of the retainer ring and/or the polishing pad.

An object of the present invention is to provide a substrate processing apparatus capable of accurately measuring the thickness of a polishing pad.

In particular, it is an object of the present invention to measure the continuous thickness distribution of a polishing pad.

In addition, an object of the present invention is to accurately detect the replacement time of the polishing pad.

In addition, an object of the present invention to accurately control the polishing parameters of the substrate in accordance with the thickness of the polishing pad.

Further, it is an object of the present invention to accurately control the conditioning parameters of the polishing pad according to the thickness of the polishing pad.

In addition, an object of the present invention is to improve the process efficiency and to improve the productivity.

Also, it is an object of the present invention to improve the polishing quality of the substrate.

The present invention for achieving the above object of the present invention provides a substrate processing apparatus, comprising: the polishing table; a polishing pad disposed on an upper surface of the polishing table; a conditioner including a conditioner head, a disk holder movably coupled to the conditioner head in a vertical direction, and a conditioning disk mounted to the disk holder and in contact with a polishing pad; and a thickness measuring unit which receives information on the relative movement distance of the disk holder with respect to the conditioner head to a sensing unit and obtains the thickness of the polishing pad from the information on the relative movement distance.

According to the present invention as described above, it is possible to accurately measure the thickness of the polishing pad and to obtain the advantageous effect of accurately controlling the chemical mechanical polishing process parameters according to the state of the polishing pad.

In addition, according to the present invention, it is possible to measure the continuous thickness distribution of the polishing pad and to obtain an advantageous effect of more precisely controlling the chemical mechanical polishing process according to the thickness distribution deviation of the polishing pad.

In addition, according to the present invention, as the disk holder formed of a metal material is used as the metallic object to be detected, the thickness distribution of the polishing pad can be measured with only one eddy current sensor without arranging a plurality of sensing objects as a sensing object of the eddy current sensor apart from each other, and thus the thickness distribution of the polishing pad can be obtained through a simple process.

According to the present invention, at least one of the pressing force of the carrier head to the substrate against the polishing pad, the rotational speed of the carrier head, and the polishing time by the carrier head can be controlled using the thickness data of the polishing pad as an index. In other words, when the thickness of the polishing pad is changed, the wear rate of the substrate is changed. Thus, it is more desirable based on the thickness of the polishing pad to control the polishing parameters such as the pressing force of the carrier, the rotational speed of the carrier head, and conditioning time so as to accurately polish the substrate to the targeted thickness.

In addition, according to the present invention, by controlling the condition of the chemical mechanical polishing process in accordance with the thickness of the polishing pad, it is possible to improve the process efficiency and obtain an advantageous effect of improving the productivity.

Further, according to the present invention, an advantageous effect of accurately detecting the thickness of the polishing pad can be obtained without interference by the liquid fluid (e.g., slurry) present on the upper surface of the polishing pad.

In addition, the present invention can improve the polishing quality of the substrate, and can obtain an advantageous effect of determining the right time of replacing the polishing pad.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
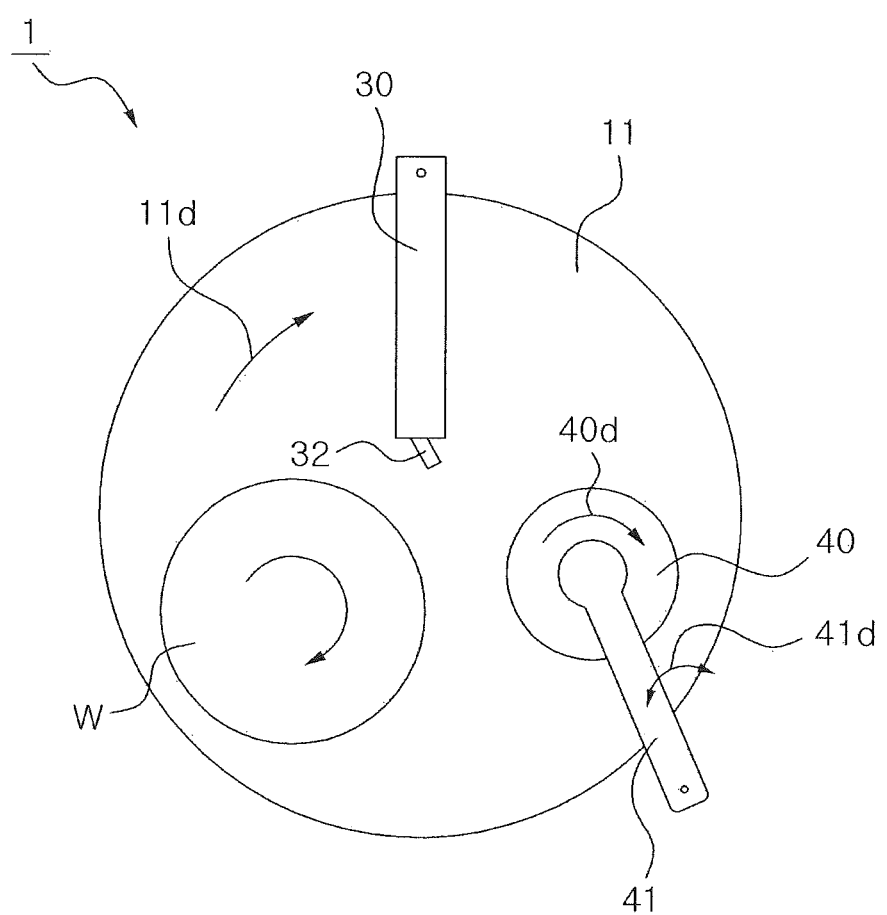
FIG. 1 is a plane view showing a configuration of a conventional substrate polishing apparatus.
Figure 2:
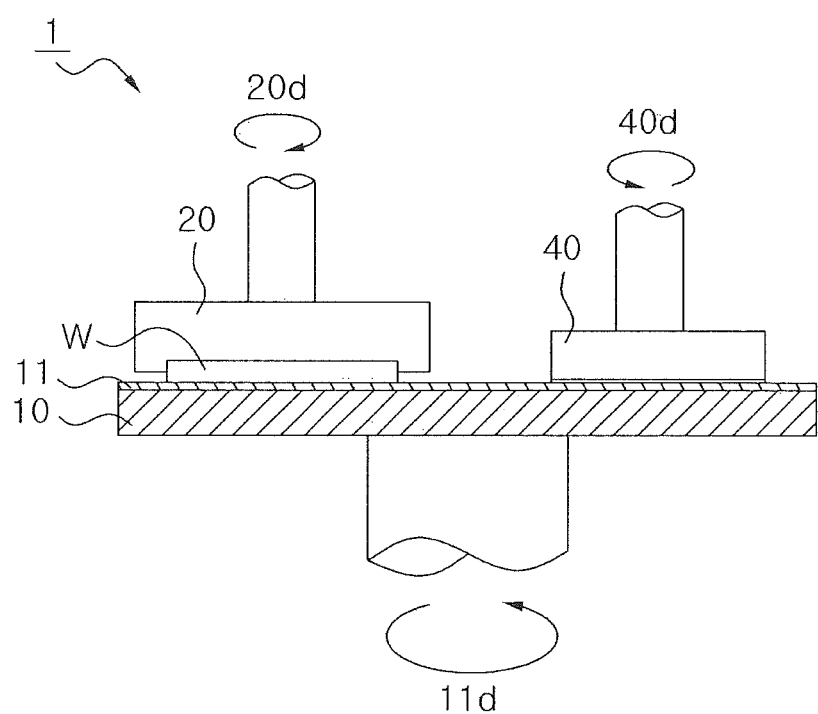
FIG. 2 is a front view of FIG. 1.
Figure 3:
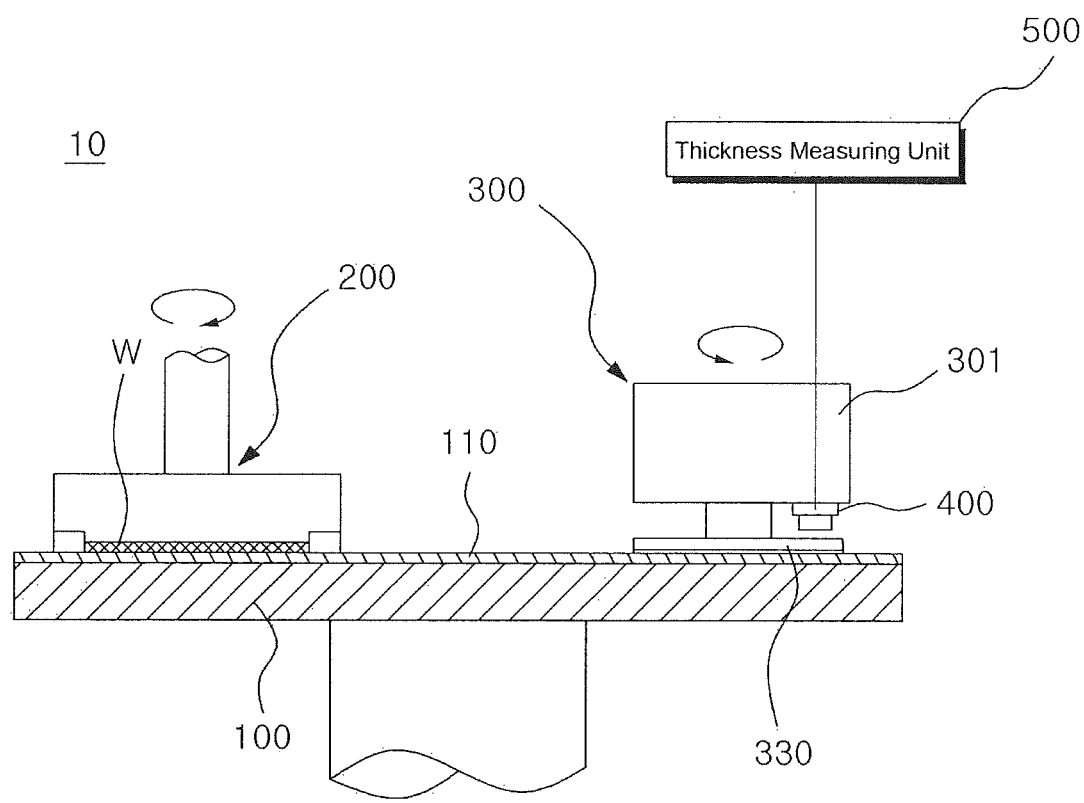
FIG. 3 is a front view of the substrate processing apparatus in accordance with one embodiment of the present invention.

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

Hereinafter, it will be described about an exemplary embodiment of the present invention in conjunction with the accompanying drawings.

As shown in FIGS. 3 to 11, a substrate processing apparatus 10 according to an embodiment of the present invention comprises: a polishing table 100; a polishing pad 110 disposed on an upper surface of the polishing table 100; a conditioner 300 including a conditioner head 301, a disk holder 330 movably coupled to the conditioner head 301 in a vertical direction, and a conditioning disk mounted to the disk holder 330 and in contact with the polishing pad 110; a sensing unit 400 for sensing a relative moving distance of the disk holder 330 with respect to the conditioner head 301; and a thickness measuring unit 500 measuring a thickness of the polishing pad 110 based on the relative moving distance detected by the sensing unit 400.

From above, the thickness value and the thickness variation of the polishing pad 110 can be obtained during the polishing process, and the parameters of the chemical mechanical polishing process can be precisely controlled according to the thickness value and the thickness variation of the polishing pad 110, and the thickness value of the substrate polishing layer can be obtained accurately.

That is, while the conditioning disk is in contact with the polishing pad 110 and the conditioning process is in progress, wear of the conditioning disk and the polishing pad occurs. when the wear of the conditioning disk proceeds more than a predetermined time, the polishing pad 110, it is difficult to accurately control the conditioning thickness and thus the conditioning quality is degraded. Therefore the conditioning disk is required to be replaced periodically after a predetermined life time.

However, the pressing force by the carrier head and slurry used in the chemical mechanical polishing process depends on the material and thickness of the polishing layer of the substrate. Recently, as the pressing force of the conditioner and the pressing force of the carrier head are changed during the chemical mechanical polishing process, in case that a conditioning disk has been used for a predetermined lifetime, the conditioning disk may be more worn than expected while the conditioning disk may be less worn than expected so as to be still available for more time.

Conventionally, as the appropriate time of replacing the conditioning disk could not be accurately recognized. Thus, although a conditioning disk was still usable, the conditioning disk was replaced by new one with stopping the polishing process thereby reducing the process efficiency. To the contrary, although a conditioning disk cannot be usable due to wear, the conditioning disk was still used thereby reducing the conditioning quality of the polishing pad.

On the other hand, the present invention measures the thickness of the polishing pad 110 in real time by using the relative movement distance of the disk holder 330 with respect to the conditioner head 301, thereby accurately measuring the thickness variation of the polishing pad 110, determining the exact replacement timing and further using the thickness data of the polishing pad 110 as a basic reference for controlling the chemical mechanical polishing process parameters.

That is, the thickness of the polishing pad 110 gradually decreases during the polishing process, and thus the disk holder 330 gradually moves downward with respect to the conditioner head 301 in proportion to the wear amount of the polishing pad 110. By detecting the downward movement distance of the disk holder 330 relative to the position of the head 301 which is fixed at a constant height, the thickness variation of the polishing pad 110 may be measured in real time during the polishing process.

Herein, as the wear rate of the substrate during the chemical mechanical polishing process varies in accordance with the thickness of the polishing pad 110, it is desirable that the control parameters of the chemical mechanical polishing process varies in real time in accordance with the change of the thickness of the polishing pad 110. Thus, the present invention uses the measured thickness of the polishing pad 110 during the polishing process as index of controlling the rotational speed of the carrier head 200, polishing time, etc.

Above all, the present invention can obtain an advantageous effect of accurately measuring the thickness of the polishing pad 110 without signal interference or signal distortion caused by liquid fluid remaining on the upper surface of the polishing pad 110. That is, it is also possible to measure the thickness of the polishing pad 110 by generating ultrasonic waves from the top of the polishing pad 110 onto the polishing pad, and then detecting a signal reflected from the upper surface of the polishing pad 110. In this case, as liquid fluid remains on the top surface of the polishing pad 110 during the polishing process, an ultrasonic signal reflected on the surface is distorted or interfered by the liquid fluid, which makes it difficult to accurately detect the ultrasonic reflection signal. However, as the present invention uses eddy current signal, it is possible to accurately detect the thickness of the polishing pad 110 without interference by the liquid fluid.

In addition, the present invention can measure the continuous thickness distribution of the polishing pad 110 by using the disk holder 330 itself as a metallic sensing object i.e., a sensing object detected by the eddy current sensor and thus the polishing process can be more precisely controlled in accordance with the continuous thickness distribution.

Furthermore, the present invention uses the disk holder 330 itself as a metallic to-be-detected body without the necessity of disposing a plurality of sensing objects, i.e., sensing objects of the eddy-current sensor, so that only one eddy current sensor is used for obtaining the thickness distribution of the polishing pad 110. There is an advantage in that the thickness distribution can be easily measured, and the thickness distribution of the polishing pad 110 can be obtained through a simple process.

The polishing table 100 is rotatably provided on the polishing part, and a polishing pad 110 for polishing the substrate W is disposed on an upper surface of the polishing table 100.

For example, the polishing table 100 may include a third metal surface 101. The third metal surface 101 may be formed with metal material on the polishing table 100, or may be the polishing table 100 itself formed of a metal material.

A mechanical polishing process is performed by that the carrier head 200 pressurizes the substrate W to the upper surface of the polishing pad 110 while the slurry is supplied to the upper surface of the polishing pad 110 by the slurry supply unit 130.

For reference, the substrate W in the present invention may be understood as a polishing object that can be polished on the polishing pad 110, and the present invention is not limited or limited by the type and characteristics of the substrate W. For example, a wafer may be used as the substrate W.

The polishing pad 110 may be formed to have a circular disk shape, and the present invention is not limited or limited by the shape and characteristics of the polishing pad 110.

A plurality of groove patterns having predetermined depths are formed on the top surface of the polishing pad 110. The groove pattern may be formed in at least one of straight, curved, circular shapes and their combinations. Hereinafter, it will be described with an exemplified constitution that a plurality of groove patterns having a concentric circle shape are formed on the top surface of the polishing pad 110 in which each groove pattern 112 has the same width and spaced apart at the same interval. In other embodiments of the present invention, the groove patterns may have different shapes or may be formed in different widths and distances, and the present invention is not limited or limited by the shape and arrangement of the groove patterns.

The conditioner 300 is provided to dress the surface of the polishing pad 110. That is, the conditioner 300 finely cuts the surface of the polishing pad 110 so that a large number of foamed pores for serving to contain slurry may not be closed, and the slurry in the foamed pores of polishing pad 110 may be smoothly supplied to the substrate held by the carrier head 200.

More specifically, the conditioner 300 includes a conditioner head 301, the disk holder 330 which is movably coupled to the conditioner head 301 in the vertical direction, and a conditioning disk 340 mounted on the bottom surface of the disk holder 330 for being in contact with the polishing pad 110, wherein the conditioning disk 340 is configured to travel back and forth relative to the polishing pad 110 along the arc-shaped path.

The conditioner head 301 may be formed in various structures capable of rotating the disk holder 330, and the present invention is not limited or limited by the structure of the conditioner head 301.

Figure 5:
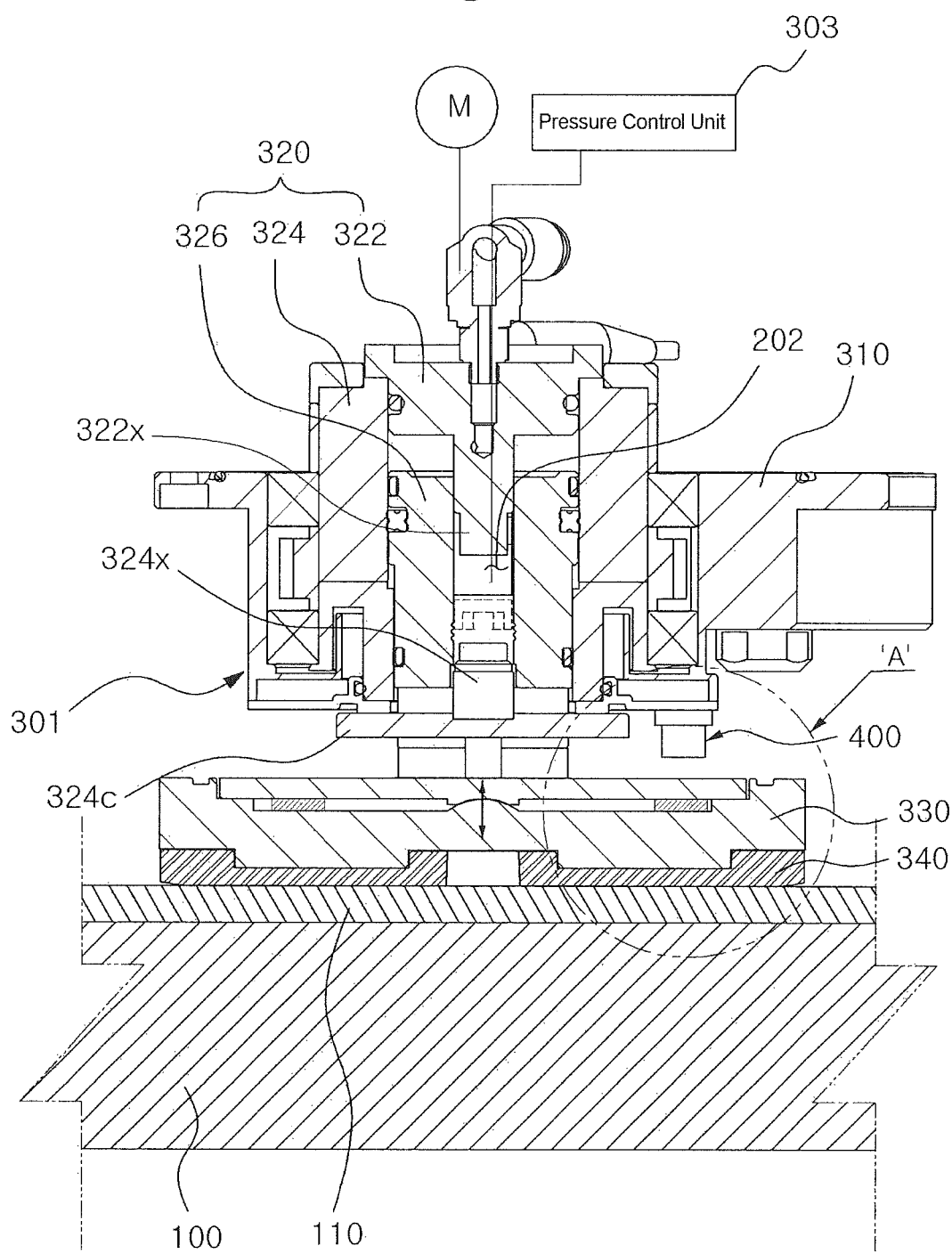
FIG. 5 is a sectional view of the conditioner in FIG. 3.

For example, referring to FIG. 5, the conditioner head 301 includes a rotation shaft 320 combined with a plurality of shaft parts, and the rotation shaft 320 mounted on a housing 310 to pivotally move in a predetermined angle range. Here, the housing 310 is installed at the end of an conditioning arm.

More specifically, the rotation shaft 320 includes a drive shaft part 322 of rotating at the same place driven by a drive motor, a transmission shaft of rotating with engaged with the drive shaft part 322 and moving in the vertical direction relative to the drive shaft part 322, and a hollow outer shaft part 324 disposed to accommodate the drive shaft part 322 and the transmission shaft part 326 in the hollow portion. According to another embodiment of the present invention, it is also possible that the rotating shaft may be formed of a single shaft part. Alternatively, the rotation axis may be provided by combining two or less shaft parts or four or more shaft parts.

For reference, the cross-section of the protrusion 322x of the drive shaft part 322 and the cross-section of the recess (not shown in drawings) of the transmission shaft part 326 are formed as non-circular e.g., an elliptical or square cross section, and thus, the transmission shaft part 326 may rotate together with the drive shaft part 322, and simultaneously the transmission shaft part 326 may move vertically relative to the drive shaft part 322. In some cases, even when the cross-section of the protrusion of the drive shaft part and the cross-section of the recess of the transmission shaft part are formed in a circular, the drive shaft part and the transmission shaft part may rotate together by which at least one locking portion such as protrusion and recess in radial direction are provided.

The disk holder 330 is provided to be movable along the up and down direction with respect to the rotation shaft 320, and rotates together with the rotation shaft 320, and moves up and down with respect to the rotation shaft 320. The conditioning disk 340 is combined at the lower portion of the disk holder 330 for modifying the polishing pad 110.

Coupling and connection structure of the rotary shaft 320 and the disk holder 330 may be variously changed according to the required parameters and design specifications. The present invention is not limited or limited by the coupling and connection structure of the rotating shaft 320 and the disk holder 330. For example, the lower end of the transmission shaft part 326 may be coupled with a holder column of the disk holder 330. And the holder column may move together when the transmission shaft part 326 moves up and down with respect to the drive shaft part 322.

In addition, although the lower end of the transmission shaft part 326 and the disk holder 330 are connected to each other, an empty space is provided in the center between them. The plate 324x is formed through an extension portion 324c extending toward the center from the outer circumferential part 324 in the empty space. The lower side of the transmission shaft part 326 is connected to the disk holder 330 through a space between the extension parts 324c to move and rotate the disk holder 330 up and down.

The pressure chamber 202 may be provided between the rotation shaft 320 and the disk holder 330. By adjusting the air pressure reaching the pressure chamber 202 by the pressure control unit 303 connected to the pressure chamber, the disk holder 330 can move in the vertical direction with respect to the rotation shaft 320. The conditioning disk 340 varies the pressing force for pressing the polishing pad 110 according to the vertical movement of the disk holder 330 with respect to the rotating shaft 320.

That is, when the positive pressure is applied to the pressure chamber through the pneumatic passage (not shown) from the pressure control unit 303, the pressure in the pressure chamber is increased, thereby air between the drive shaft part 322 and the transmission shaft part 326 expands and pushes the transmission shaft part 326 and the disk holder 330 downwards. Accordingly, the conditioning disk 340 may adjust the pressing force for pressing the polishing pad 110. Here, a known configuration such as a rotary union may be used to adjust the pressure of the rotating pressure chamber. According to another embodiment of the present invention, the disk holder may be configured to move up and down by a magnetic force with respect to the axis of rotation.

The sensing unit 400 is provided to detect a relative movement distance of the disk holder 330 with respect to the conditioner head 301.

Here, the relative movement distance of the disk holder 330 with respect to the conditioner head 301 is defined as the distance that the disk holder 330 moves up and down with respect to the positional conditioner head 301.

Figure 6:
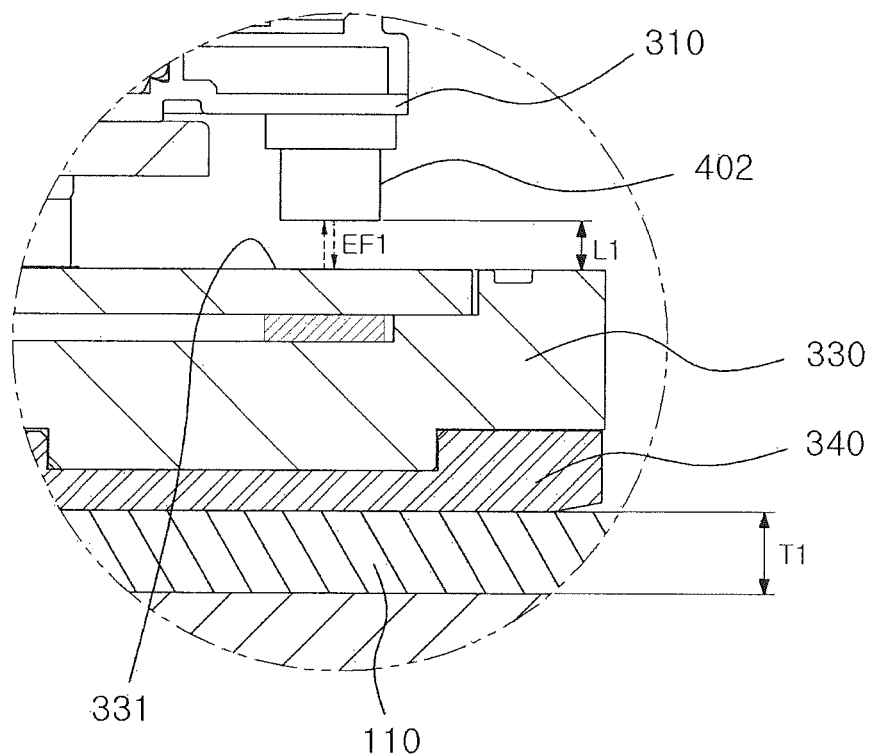
FIG. 6 and FIG. 7 are enlarged views of "A" in FIG. 3.
Figure 7:
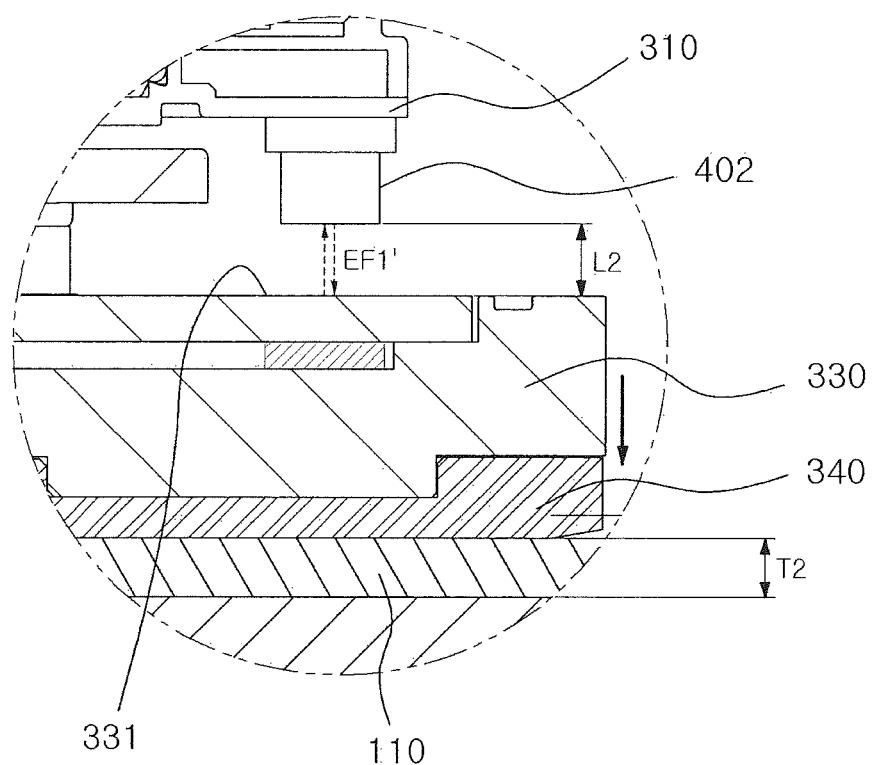

For example, referring to FIGS. 5 to 7, the sensing unit 400 may be mounted on the conditioner head 301 to detect a relative movement distance of the disk holder 330 with respect to the conditioner head 301.

Various sensors capable of sensing the relative movement distance of the disk holder 330 relative to the conditioner head 301 may be used as the sensing unit 400. The present invention is not limited or limited by the type of sensor and the measuring method.

For example, a first eddy current sensor mounted on the conditioner head 301 at a position spaced apart from the first metal surface 331 formed on the disk holder 330 and sensing a first eddy current signal on the first metal surface 331 may be used as the sensing unit 400.

Here, the meaning that disk holder 330 includes the first metal surface 331 is defined to include that the metal member formed of the metal material is mounted on the disk holder 330 to provide the first metal surface 331, and that the disk holder 330 itself is formed of a metal material so that the upper surface of the metallic disk holder 330 forms the first metal surface 331.

The first eddy current sensor 402 is mounted to the conditioner head 301 at a position spaced apart from the first metal surface 331. The first eddy current sensor 402 applies an eddy current to the first metal surface 331 and receives an output signal EF such as a resonance frequency or an impedance from the first metal surface 331.

The first eddy current sensor 402 includes a sensor coil (not shown) in the shape of a hollow spiral wound n times. The first eddy current sensor 402 receives an alternating current from the control unit, applies an input signal from the sensor coil in the form of a magnetic flux, and applies an eddy current to the conductor i.e., polishing layer of electrical conductive material. Therefore, when the thickness of the conductor changes or when the distance from the conductor changes, the distance to the conductor i.e., the first metal plane is measured from the output signal due to the change of eddy current generated in the conductor.

More specifically, the first eddy current sensor 402 receives an eddy current signal from an upper surface i.e., first metal surface of the disk holder 330 formed of a metal material.

For reference, when there is no conductive material, the output signal received by the first eddy current sensor 402 is a default value or zero. When there is a conductive material, the output signal received by the first eddy current sensor 402 becomes a value reduced by the impedance decrease from the reference value or zero. The output value of the first eddy current sensor 402 may be represented by a voltage.

Preferably, the first eddy current sensor 402 is mounted to the lowest end of the conditioner head 301 at the position closest to the first metal surface 331 in the conditioner head 301. As an example, the first eddy current sensor 402 may be mounted on a bottom surface of the casing forming the outline of the conditioner head 301.

In this manner, the first eddy current sensor 402 is mounted on the lowermost end of the conditioner head 301 (the bottom of the casing), whereby the sensing accuracy of the first eddy current sensor 402 can be improved.

Figure 8:
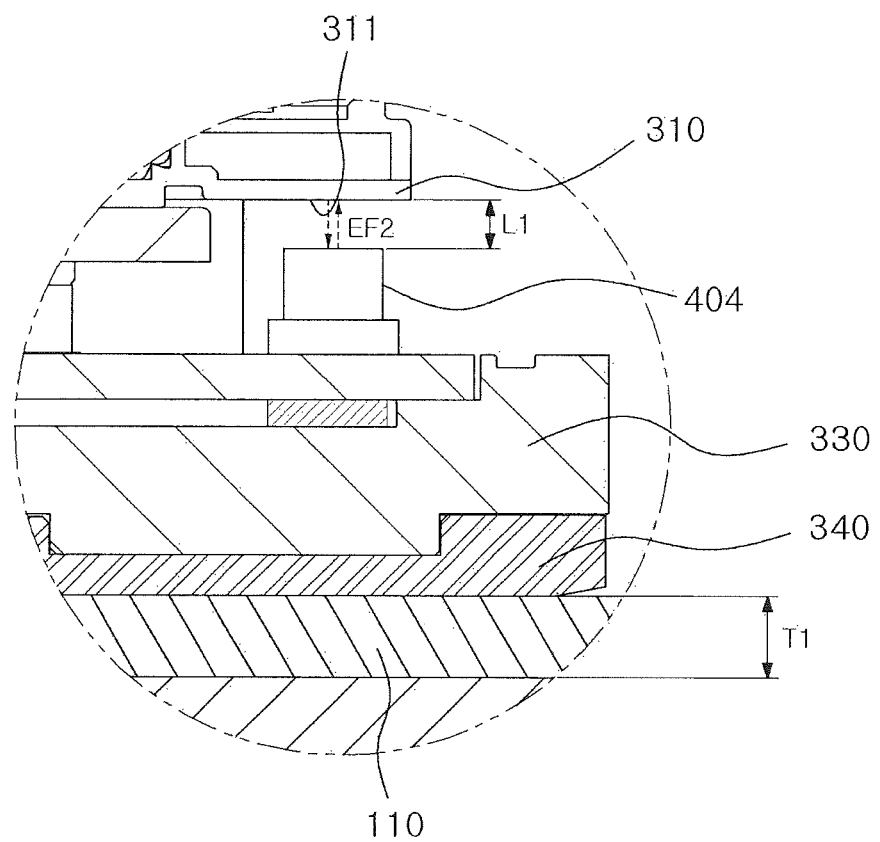
FIG. 8 and FIG. 9 are views of a sensing unit of the substrate processing apparatus in FIG. 3.
Figure 9:
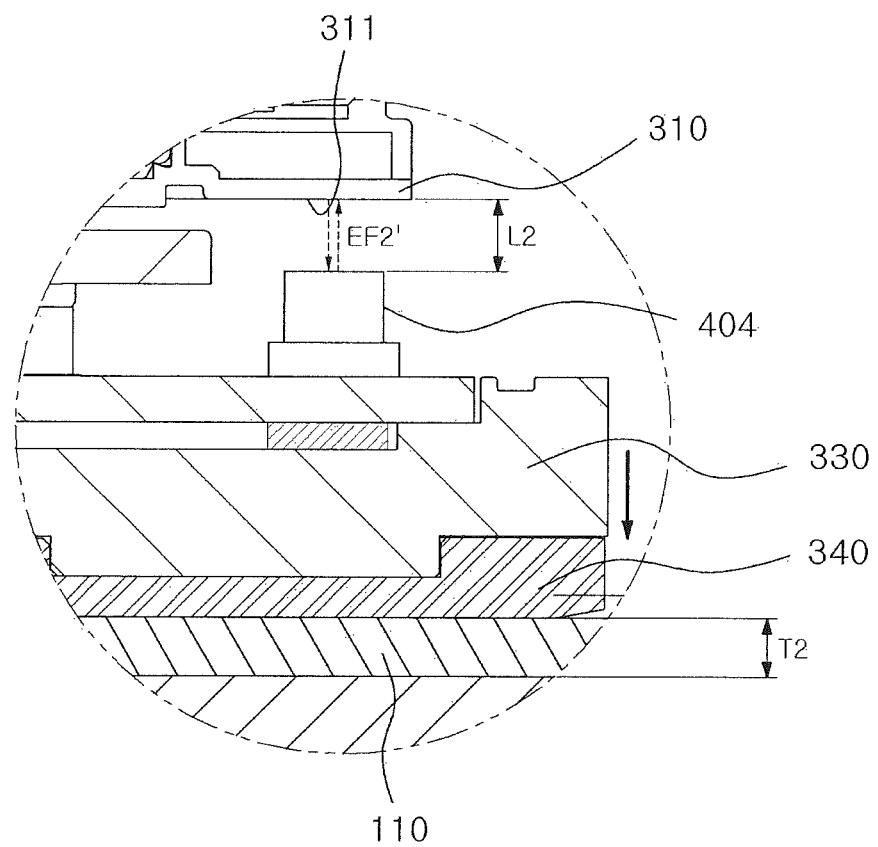
Figure 10:
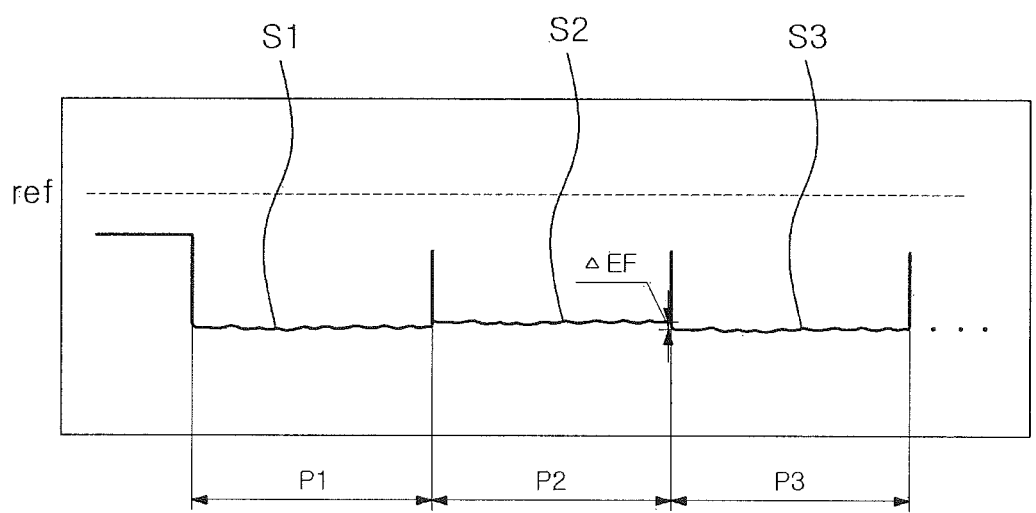
FIG. 10 is a diagram illustrating an eddy current signal distribution detected by the sensing unit.

As another example, referring to FIGS. 8 and 9, the sensing unit 400 may be mounted on the disk holder 330 to measure a relative movement distance of the disk holder 330 with respect to the conditioner head 301.

For example, the second eddy current sensor 404 for receiving the second eddy current signal from the second metal surface 311 may be used as the sensing unit 400, and the second eddy current sensor 404 is mounted to the disk holder 330 at a position spaced apart from the second metal surface 311 of the conditioner head 301.

Here, the meaning that the conditioner head 301 includes the second metal surface 311 is defined to include that the metal member formed of the metal material is mounted on the conditioner head 301 to provide the second metal surface 311, and that the conditioner head 301 itself is formed of a metal material so that the bottom surface of the metallic conditioner head 301 forms the second metal surface 311.

The second eddy current sensor 404 is mounted to the disk holder 330 at a position spaced apart from the second metal surface 311. The second eddy current sensor 404 applies an eddy current to the second metal surface 311 and receives an output signal EF such as resonant frequency or impedance signal from the second metal surface 311.

The second eddy current sensor 404 includes a sensor coil (not shown) in the shape of a hollow spiral wound n times, receives an alternating current from a control unit, and applies an input signal in the form of magnetic flux from the sensor coil to a conductor i.e., polishing layer of conductive material whereby eddy current is applied to the polishing layer of the material. When the thickness of the conductor is changed or when the distance from the conductor is changed, an output signal such as the resonance frequency or impedance signal due to the eddy current generated in the conductor is changed and received. The distance to the conductor i.e., the second metal surface is measured from the change of the output signal.

More specifically, the second eddy current sensor 404 receives the eddy current signal from the bottom i.e., second metal surface of the conditioner head 301 formed of metal.

For reference, when there is no conductive material, the output signal received by the second eddy current sensor 404 is a default value or zero. When there is a conductive material, the output signal received by the second eddy current sensor 404 becomes a value reduced by the impedance decrease from the reference value or zero. The output value of the second eddy current sensor 404 may be represented by a voltage.

Preferably, the second eddy current sensor 404 is mounted on the uppermost end of the disk holder 330 at the position closest to the second metal surface 311 in the disk holder 330.

In this manner, the second eddy current sensor 404 is mounted on the uppermost end of the disk holder 330, whereby the sensing accuracy of the second eddy current sensor 404 can be improved.

The thickness measuring unit 500 measures the thickness of the polishing pad 110 based on the relative movement distance of the disk holder 330 with respect to the conditioner head 301 obtained by the sensing unit 400.

More specifically, the thickness measuring unit 500 measures the thickness of the polishing pad 110 from the eddy current signal obtained by at least one of the first eddy current sensor 402 and the second eddy current sensor 404.

For reference, the eddy current signal obtained by the first eddy current sensor 402 or the second eddy current sensor 404 changes according to the thickness of the polishing pad 110. For example, as shown in FIG. 7, in response to the thickness reduction (T2>T1) of the polishing pad 110, the disk holder 330 moves downwards, and the distance between the first metal surface of the disk holder 330 and the first eddy current sensor 402 increases (L2>L1), and thus the eddy current signal obtained by the first eddy current sensor 402 also changes (i.e., decreases). the thickness of the polishing pad 110 may be measured in real time from the obtained eddy current signal.

Figure 4:
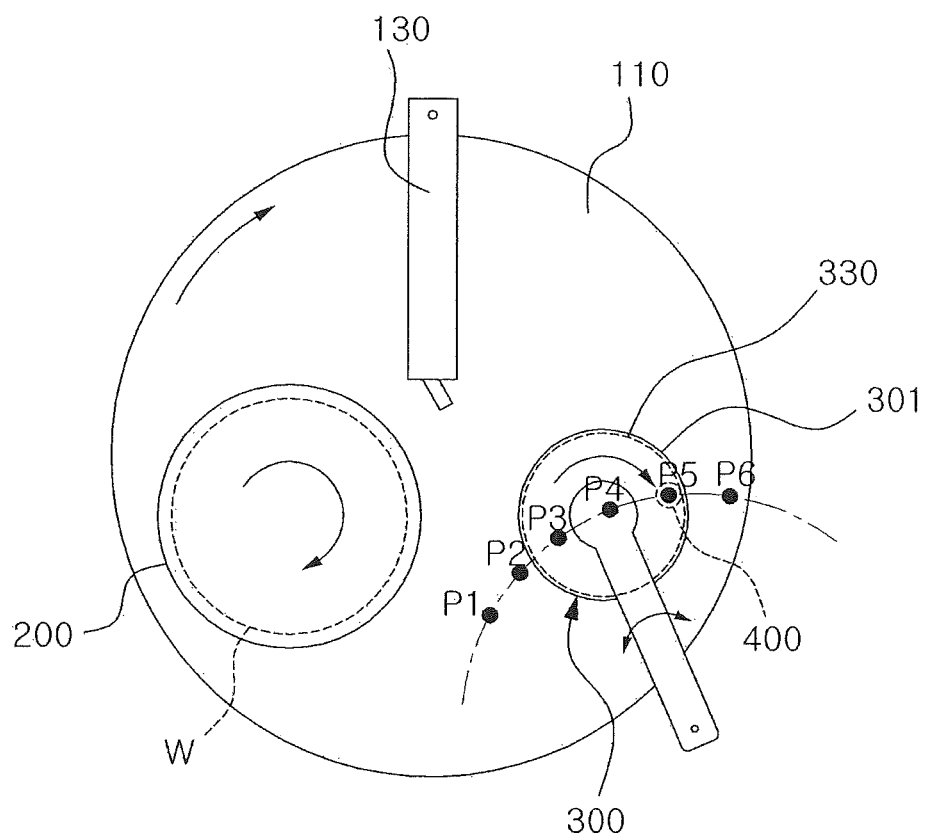
FIG. 4 is a plane view of FIG. 3.

Preferably, the thickness measuring unit 500 continuously measures the thickness distribution of the polishing pad 110 along the moving path of the conditioner 300. Here, the meaning that the thickness distribution of the polishing pad 110 is continuously measured along the moving path of the conditioner 300 is defined, as shown in FIG. 4, that the thickness is measured at a plurality of points P1 to P6 along the moving path of the conditioner 300.

As such, by mounting the first eddy current sensor 402 on the conditioner head 301, obtaining the eddy current signal of the first eddy current sensor 402 from the first metal surface 331 of the disk holder 330, and measuring the thickness of the pad 110 from the eddy current signal, it is possible to obtain the continuous thickness distribution of the polishing pad 110, which may be used as a basic material for controlling the chemical mechanical polishing process parameters. In particular, the chemical mechanical polishing process can be differently and precisely controlled based on the thickness distribution variation (ΔEF in FIG. 10) of the polishing pad 110.

In addition, as the metal disk holder 330 or the conditioner head 301 itself as the metallic sensing object 410, the present invention does not require a plurality of the sensing object 410 (i.e., the sensing object of the eddy current sensor) to be spaced apart from one another. Thus, the thickness distribution of the polishing pad 110 may be measured with only one eddy current sensor 400

More preferably, the thickness measuring unit 500 measures the thickness of the polishing pad 110 in real time during the conditioning process of the polishing pad 110. By this, the parameters of the chemical mechanical polishing process may be controlled in real time according to the thickness of the polishing pad 110 during the conditioning process or the substrate polishing process.

Meanwhile, in the above-described and illustrated embodiments of the present invention, an example is described in which an eddy current sensor for obtaining or detecting an eddy current is used as the sensing unit 400. It is also possible to use a distance sensor such as an optical distance sensor or a contact distance sensor for obtaining the distance between conditioner head 301 and the disk holder 330.

Figure 11:
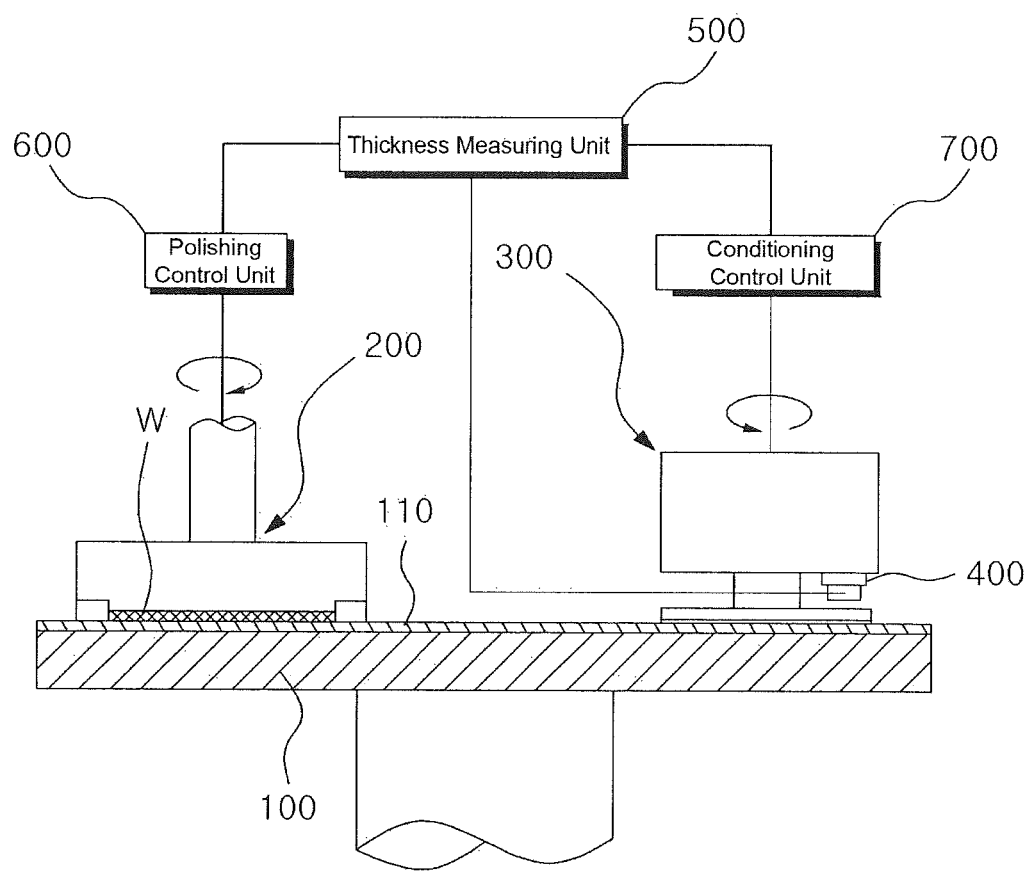
FIG. 11 is a drawing for explaining the polishing control unit and the conditioner control unit.

Meanwhile, referring to FIG. 11, the substrate processing apparatus 10 of the present invention further comprises a polishing control unit 600 which controls the polishing condition of the substrate W with the thickness of the polishing pad 110 as a control index measured by the thickness measuring unit 500.

Here, the meaning that the polishing control unit 600 controls the polishing parameters of the substrate W by using the thickness of the polishing pad 110 as a control index is defined that the measured thickness of the polishing pad 110 is regarded as a main control variable for the polishing control unit 600 to control the polishing parameters of the substrate W. For example, when the thickness of the polishing pad 110 is measured as "A", the substrate W is polished with "A" polishing parameters suitable for the thickness "A" of the polishing pad 110, while the thickness of the polishing pad 110 is measured as "B", the substrate W is polished with "B" polishing parameters suitable for the thickness "B" of the polishing pad 110. As the thickness of the polishing pad decreases, it is a tendency that the wear rate of substrate W increases. Thus, as the thickness of the polishing pad decreases, based on the thickness variation of the polishing pad, the polishing control unit 600 may control the polishing parameters such as the pressing force of the carrier head, the rotational speed of the carrier head 200 lower.

Specifically, the polishing control unit 600 uses the thickness of the polishing pad 110 as a control index, and controls parameters of the polishing process such as the pressing force of the carrier head 200 for pressing the substrate W to the polishing pad 110, the rotation of the carrier head 200 and polishing time by the carrier head 200. In other words, when the thickness of the polishing pad is changed, the wear rate of the substrate is changed. Also, the initial thickness of the polishing pad is known by measuring before installing onto the polishing table. Thus, as the polishing process proceeds, the changed amount of the polishing pad 110 is measured and thus the thickness of the polishing pad 110 is obtained in real time by subtracting the changed amount of the polishing pad 110 from the initial thickness in every polishing process. Therefore it is more desirable based on the thickness of the polishing pad to control the polishing parameters such as the pressing force of the carrier, the rotational speed of the carrier head, and conditioning time so as to accurately polish the substrate to the targeted thickness, whereby the change of the wear rate of the substrate W depending on the thickness change of the polishing pad 110 may be compensated.

Referring to FIG. 11, the conditioner control unit 700 of the substrate processing apparatus 10 controls the conditioning parameters of the polishing pad 110 using the thickness of the polishing pad 110 measured by the thickness measuring unit 500 as a control index.

That is, the polishing amount of the substrate W may be controlled not only by at least one of the pressing force of the carrier head 200, the rotational speed of the carrier head 200, and the polishing time by the carrier head 200, but also by controlling the conditioning parameters of the conditioner 300. In other words, the polishing amount of the substrate W may be controlled by the conditioning state of the polishing pad 110.

Here, the meaning that the polishing control unit 600 controls the conditioning conditions of the polishing pad 110 by using the thickness of the polishing pad 110 as a control index is defined that the conditioning parameters of the polishing pad 110 is controlled based on the measured thickness of the polishing pad 110. For example, when the thickness of the polishing pad 110 is measured as 'A', the substrate W may be polished with 'A' conditioning condition suitable for the thickness 'A' of the polishing pad 110. When the thickness of the polishing pad 110 is measured as 'B', the substrate W may be polished with 'B' conditioning conditions suitable for the thickness 'B' of the polishing pad 110.

Specifically, the polishing control unit 600 uses the thickness of the polishing pad 110 as a control index, and controls at least one of the pressing force of the conditioner 300 onto the polishing pad 110, the rotational speed of the conditioning disk. In other words, when the thickness of the polishing pad is changed, the wear rate of the substrate is changed. Also, the initial thickness of the polishing pad is known by measuring before installing onto the polishing table. Thus, as the polishing process proceeds, the changed amount of the polishing pad 110 is measured and thus the thickness of the polishing pad 110 is obtained in real time by subtracting the changed amount of the polishing pad 110 from the initial thickness in every polishing process. Therefore it is more desirable based on the thickness of the polishing pad to control the conditioning parameters such as the pressing force of the conditioner 300, the rotational speed of the conditioning disk so as to accurately polish the substrate to the targeted thickness, whereby the change of the wear rate of the substrate W depending on the thickness change of the polishing pad 110 may be compensated.

In some cases, it is also possible to simultaneously control the polishing parameters and the conditioning parameters according to the thickness of the polishing pad 110.

In this way, by controlling the polishing conditions and conditioning conditions, an advantageous effect of accurately controlling the amount of polishing per unit time (i.e., wear rate) during the chemical mechanical polishing process regardless of the thickness variation of the polishing pad 110.

Figure 12:
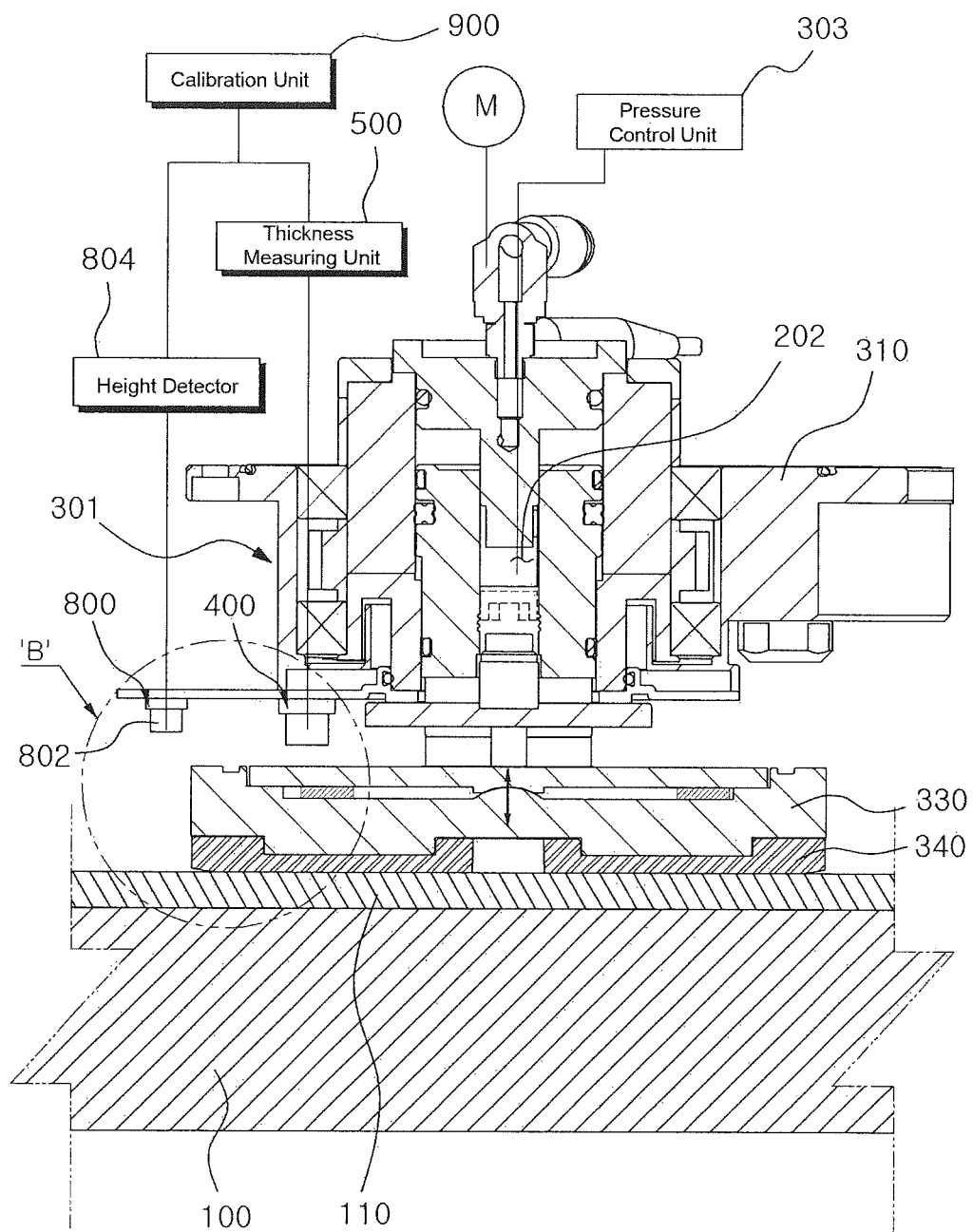
FIG. 12 is a drawing of the substrate processing apparatus in accordance with other embodiment of the present invention.
Figure 13:
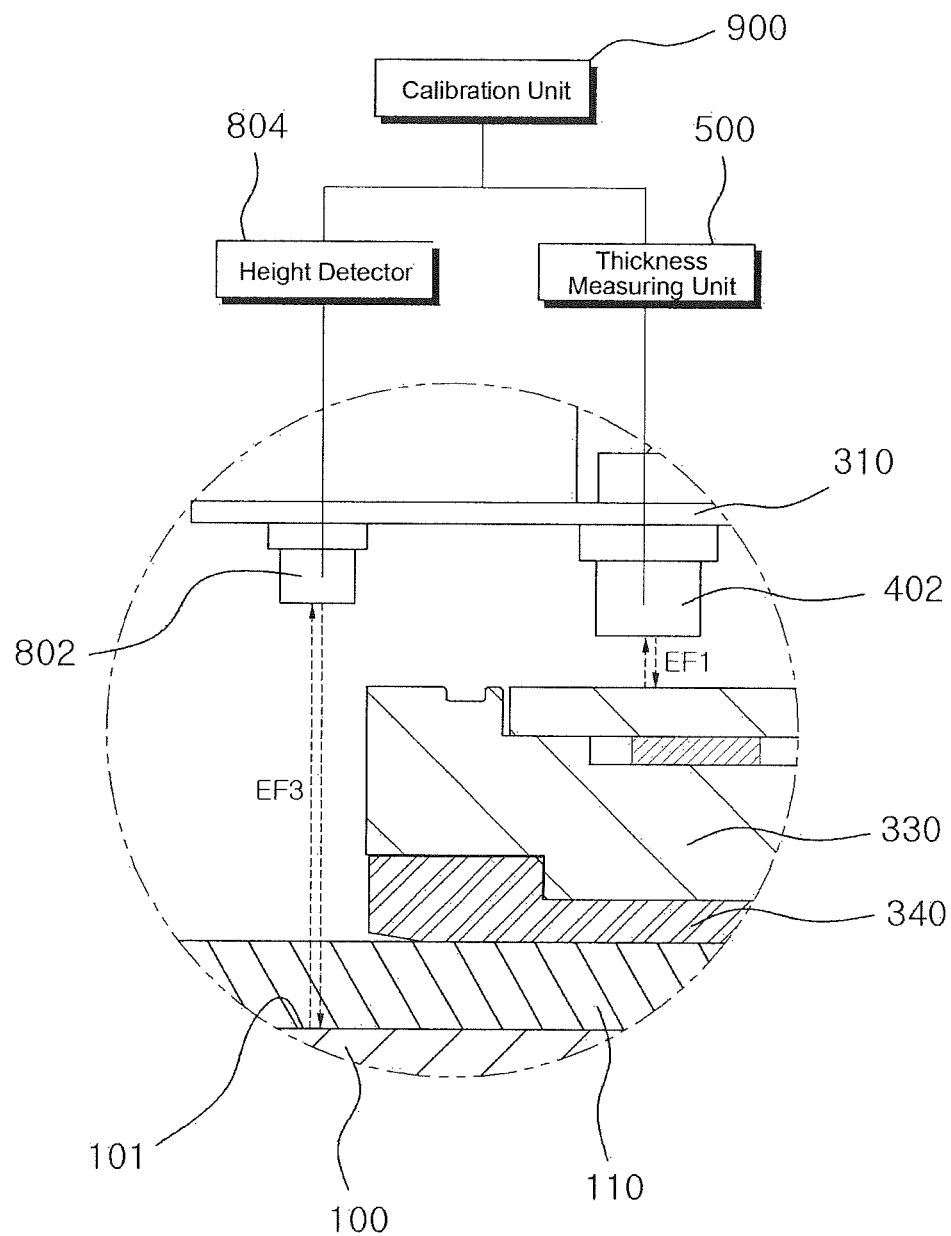
FIG. 13 is an enlarged view of 'B' in FIG. 12.
Figure 14:
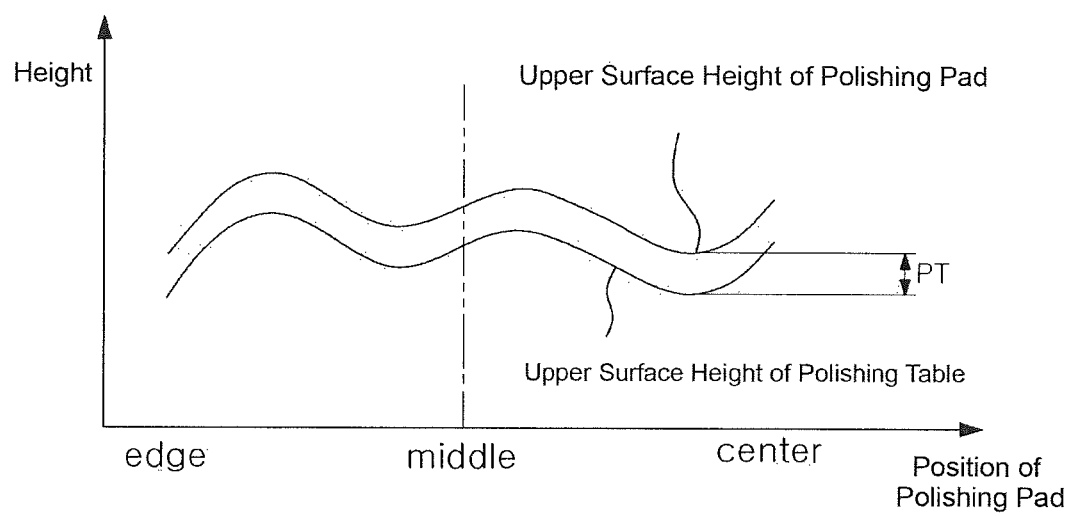
FIG. 14 is a diagram for explaining the process of measuring the thickness of the polishing pad.

As shown in FIGS. 12 to 14, a substrate processing apparatus according to another embodiment of the present invention comprises: a polishing table 100; a polishing pad 110 disposed on an upper surface of the polishing table 100; a conditioner including a conditioner head 301, a disk holder 330 movably coupled to the conditioner head 301 in a vertical direction, and a conditioning disk mounted to the disk holder 330 in contact with the polishing pad 110; a sensing unit 400 for sensing a relative moving distance of the disk holder 330 with respect to the conditioner head 301; a thickness measuring unit 500 measuring a thickness of the polishing pad 110 based on the relative moving distance received by the sensing unit 400; a height measuring unit 800 for measuring the height of the upper surface of the polishing table 100; and a calibration unit 900 for calibrating the thickness of the polishing pad 110 on the basis of the height deviation of the upper surface for each position of the polishing table 100 measured by the height measuring unit 800.

As in the above described embodiment, a first eddy current sensor 402 may be used as the sensing unit 400 which is mounted on the conditioner head 301 to be spaced apart from the first metal surface 331 formed in the disk holder 330 and detect a first eddy current in the first metal surface 331. In some cases, a second eddy current sensor 404 may be used as the sensing unit 400 which is mounted on the disk holder 330 to be spaced apart from the second metal surface 311 formed in the conditioner head 301 and detects a second eddy current signal in the second metal surface 311.

Various sensing means capable of measuring the height of the upper surface of the polishing table 100 may be used as the height measuring unit 800.

For example, the height measuring unit 800 includes a third eddy current sensor 802 provided in the conditioner 300 for obtaining a third eddy current signal from the third metal surface 101 formed in the polishing table 100, and a height detector 804 for detecting the height of the upper surface of the polishing table 100 from the third eddy current signal received by the sensor 802.

The third eddy current sensor 802 applies an eddy current to the third metal surface 101 formed on the polishing table 100 and receives output signal EF such as resonant frequency or impedance signal from the third metal surface 101

The third eddy current sensor 802 includes a sensor coil (not shown) in the shape of a hollow spiral wound n times. The third eddy current sensor 802 receives an alternating current from the control unit, applies an input signal from the sensor coil in the form of magnetic flux, and applies an eddy current to the conductor i.e., polishing layer of electrical conductive material. Therefore, when the thickness of the conductor changes or when the distance from the conductor changes, the distance to the conductor i.e., the third metal plane is measured from the output signal due to the change of eddy current generated in the conductor.

More specifically, the third eddy current sensor 802 detects an eddy current signal from an upper surface of the polishing table 100 formed of a metal material.

For reference, when there is no conductive material, the output signal received by the third eddy current sensor 802 is a default value or zero. When there is a conductive material, the output signal received by the third eddy current sensor 802 becomes a value reduced by the impedance decrease from the reference value or zero. The output value of the third eddy current sensor 802 may be represented by a voltage.

Preferably, the third eddy current sensor 802 is mounted to the conditioner head 301 at the outer region of the disk holder 330, while the first eddy current sensor is mounted to the conditioner head at the inner region of the disk holder. The third eddy current sensor 802 always monitors only the third metal surface 101 by disposing the third eddy current sensor 802 in the outer region of the first metal surface 331 of the disk holder 330, whereby the advantageous effect of increasing the sensing accuracy of the third eddy current sensor 802 can be obtained.

The height detector 804 detects the height of the upper surface of the polishing table 100 from the third eddy current signal detected by the third eddy current sensor 802.

Here, the meaning of detecting the height of the upper surface of the polishing table 100 is defined as detecting the height variation of the upper surface for each position of the polishing table 100.

For reference, the signal (e.g., eddy current signal) detected by the third eddy current sensor 802 has a correlation with the upper surface height of the polishing table 100. For example, in a position where the upper surface height of the polishing table 100 is high, the distance between the third eddy current sensor 802 and the third metal surface 101 (i.e., upper surface) of the polishing table 100 decreases, and thus the third eddy current signal detected by the eddy current sensor 802 also changes (increases). Therefore, the height of the polishing table 100 may be detected by sensing the eddy current signal.

The calibration unit 900 is provided to calibrate the thickness information of the polishing pad 110 measured by the thickness measuring unit 500 based on the positional height deviation of each surface of the polishing table 100 measured by the height measuring unit 800.

More specifically, after the measurement of the thickness of the polishing pad 110, if the height of the upper surface of the polishing table 100 is higher or lower than a predefined reference height, the calibration unit 900 may calibrate the thickness information of the polishing pad 110 measured by the thickness measuring part 500 by a difference between the reference height and the actual measurement height.

Referring to FIG. 14, when the height of the top surface of the polishing table 100 is known and the top height of the polishing pad 110 is known, the thickness of the polishing pad 110 may be obtained at the actual measurement locations by calibrating the thickness information of the polishing pad 110 with the positional height deviation of each surface of the polishing table 100.

As described above, by calibrating the thickness of the polishing pad 110 with the positional height deviation of the polishing table 100, an advantageous effect of improving the thickness measurement accuracy of the polishing pad 110 may be obtained.

That is, in order to accurately measure the thickness of the polishing pad 110 based on the relative movement distance of the disk holder 330 with respect to the conditioner head 301, the height of the upper surface of the polishing table 100 should be uniform. However, if the height of the upper surface of the polishing table 100 is not uniform according to the position or area (e.g., by a height deviation of 10 to 50 μm) due to a machining error or the like, as the relative moving distance of the disk holder 330 with respect to the conditioner head 301 cannot be accurately measured, the thickness measurement accuracy of the polishing pad 110 is reduced.

However, according to the present invention, before measuring the thickness of the polishing pad 110, the height difference of the upper surface for each position of the polishing table 100 is obtained in advance, by calibrating the thickness of the polishing pad 110 with the height difference of the upper surface for each position of the polishing table 100, an advantageous effect of further improving the thickness measurement accuracy of the polishing pad 110 can be obtained.

More specifically, the calibration unit 900 may calibrate the thickness of the polishing pad 110 measured by the thickness measuring unit 500 with the deviation between the reference height of the pre-stored polishing table 100 and the actual surface height of the polishing table 100.

The thickness of the polishing pad 110 obtained as described above is used to calibrate the thickness of the polishing layer of the substrate on which the polishing process is performed. In general, a sensor is installed on the polishing table or polishing pad 110 for obtaining the thickness of the polishing layer of the substrate during the polishing process. During the polishing process, there is an error in measuring the thickness of the polishing layer of the substrate as much as the thickness variation of the polishing pad 110. Accordingly, by compensating the measured thickness value of the substrate polishing layer by the amount of variation in the thickness of the polishing pad 110 obtained during the polishing process as described above, the polishing layer thickness value of the substrate is more accurately obtained during the polishing process and thus to achieve the effect of accurately determining the end point of polishing process.

Moreover, the surface of the polishing pad may have some height deviation in radial direction as well as in circumferential direction. Therefore, when the thickness distribution of the polishing pad is measured based on any one spot, a variation in the thickness measurement may occur which makes difficult to utilize to calibrate the thickness value of the substrate polishing layer. However, in the present invention, the thickness variation of the polishing pad is obtained by the vertical movement amount of the conditioning disk 340, so that the averaged value of the thickness variation due to the wear of the polishing pad may be easily obtained without additional signal processing. Through this, in the present invention, the polishing control unit 600 may control the polishing parameters such as the pressing force, the rotation speed, the polishing time, and the like using the thickness variation of the polishing pad 110 as a control index and thus the wear rate of the substrate may be controlled regardless of the variation of the thickness of the polishing pad 110. In addition, the averaged value of the thickness variation according to the wear of the polishing pad may be reflected in the polishing layer thickness measurement value of the substrate, thereby obtaining an advantage of more accurately detecting the end point for stopping of the substrate polishing process.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

EXPLANATION OF NUMERALS

100: polishing table
101: a third metal surface
110: polishing pad
200: carrier head
300: conditioner
310: conditioner head
310: casing
311: a second metal surface
320: rotational shaft
330: disk holder
331: a first metal surface
340: conditioning disk
400: sensing unit
402: a first eddy current sensor
404: a second eddy current sensor
600: polishing control unit
700: conditioner control unit
800: height measuring unit
802: a third eddy current sensor
804: height detector
900: calibration unit

What is claimed is:

1. A substrate processing apparatus, comprising:
a polishing table;
a polishing pad disposed on an upper surface of the polishing table;
a conditioner including a conditioner head, a disk holder movably coupled to the conditioner head in a vertical direction, and a conditioning disk mounted to the disk holder and in contact with the polishing pad; and
a thickness measuring unit of obtaining the thickness of the polishing pad from the relative moving distance of the disk holder with respect to the conditioner head, wherein the information of the relative moving distance is received from a sensing unit,
wherein the sensing unit is mounted on the disk holder at a position spaced apart from a metal surface, the sensing unit comprising an eddy current sensor to receive an eddy current signal from the metal surface,
wherein the conditioner head is formed of metal, and the eddy cu r receives the eddy current signal from the bottom of the conditioner head.

2. The substrate processing apparatus of claim 1, wherein the thickness measuring unit obtains the thickness of the polishing pad during the conditioning process of the polishing pad.

3. The substrate processing apparatus of claim 1, wherein the conditioner is configured to travel back and forth relative to the polishing pad along the predetermined arc-shaped path, and wherein the thickness measuring unit obtains the thickness distribution along the arc-shaped path.

4. The substrate processing apparatus of claim 1, further comprising:
a polishing control unit for controlling at least one polishing parameter based on the measured thickness of the polishing pad as a control index.

5. The substrate processing apparatus of claim 4, wherein the polishing parameter includes at least one of the pressing force by a carrier head to the substrate against the polishing pad, polishing time, rotational speed of the carrier head.

6. The substrate processing apparatus of claim 1, further comprising:
a conditioner control unit for controlling at least one conditioning parameter based on the measured thickness of the polishing pad as a control index.

7. The substrate processing apparatus of claim 6, wherein the conditioning parameter includes at least one of pressing force of the conditioner, rotational speed of the conditioning disk and the conditioning time.

8. A substrate processing apparatus, comprising:
a polishing table;
a polishing pad disposed on an upper surface of the polishing table;
a conditioner including a conditioner head, a disk holder movably coupled to the conditioner head in a vertical direction, and a conditioning disk mounted to the disk holder and in contact with the polishing pad; and
a thickness measuring unit of obtaining the thickness of the polishing pad from the relative moving distance of the disk holder with respect to the conditioner head, wherein the information of the relative moving distance is received from a sensing unit,
wherein the sensing unit is mounted on the uppermost end of the disk holder at a position adjacent to a second metal surface, the sensing unit comprising an eddy current sensor to receive an eddy current signal from the metal surface.

9. A substrate processing apparatus, comprising:
a polishing table;
a polishing pad disposed on an upper surface of the polishing table;
a conditioner including a conditioner head, a disk holder movably coupled to the conditioner head in a vertical direction, and a conditioning disk mounted to the disk holder and in contact with the polishing pad;
a thickness measuring unit of obtaining the thickness of the polishing pad from the relative moving distance of the disk holder with respect to the conditioner head, wherein the information of the relative moving distance is received from a sensing unit;
a height measuring unit for measuring the height of the upper surface of the polishing table; and
a calibration unit for calibrating the thickness of the polishing pad on the basis of the height deviation of the upper surface for each position of the polishing table measured by the height measuring unit,
wherein the height measuring unit includes:
an additional eddy current sensor provided in the conditioner for obtaining an additional eddy current signal from an additional metal surface formed in the polishing table; and
a height detector for detecting the height of the upper surface of the polishing table from the additional eddy current signal obtained by the additional eddy current sensor.

10. The substrate processing apparatus of claim 9, wherein the additional eddy current sensor is mounted on the conditioner head at an outer region of the disk holder.

11. A substrate processing apparatus, comprising:
a polishing table;
a polishing pad disposed on an upper surface of the polishing table;
a conditioner including a conditioner head, a disk holder movably coupled to the conditioner head in a vertical direction, and a conditioning disk mounted to the disk holder and in contact with the polishing pad;
a eddy current sensor mounted on the conditioner head at a position spaced apart from a metal surface formed on the disk holder and sensing a eddy current signal on the metal surface;

a thickness measuring unit of obtaining the thickness of the polishing pad based on the eddy current signal obtained by the for eddy current sensor;

an additional eddy current sensor mounted on the conditioner and sending an additional eddy current signal from an additional metal surface formed on the polishing table;

a height measuring unit of obtaining the height of the upper surface of the polishing table from the additional eddy current signal obtained by the additional eddy current sensor; and a calibration unit for calibrating the thickness of the polishing pad on the basis of the height deviation of the upper surface for each position of the polishing table measured by the height measuring unit.

12. The substrate processing apparatus of claim 11, wherein the eddy current sensor is mounted to the conditioner head at an inner region of the disk holder, and wherein the additional eddy current sensor is mounted to the conditioner head at an outer region of the disk holder.

* * * * *